(12) United States Patent
Tsuchiya et al.

(10) Patent No.: US 7,521,893 B2
(45) Date of Patent: Apr. 21, 2009

(54) BATTERY APPARATUS AND DISCHARGE CONTROLLING METHOD OF BATTERY APPARATUS

(75) Inventors: Yukio Tsuchiya, Kanagawa (JP); Hideyuki Sato, Chiba (JP); Masaki Sakurai, Tokyo (JP)

(73) Assignee: Sony Corporation, Tokyo (JP)

( * ) Notice: Subject to any disclaimer, the term of this patent is extended or adjusted under 35 U.S.C. 154(b) by 471 days.

(21) Appl. No.: 11/080,955

(22) Filed: Mar. 15, 2005

(65) Prior Publication Data

US 2005/0206348 A1    Sep. 22, 2005

(30) Foreign Application Priority Data

Mar. 16, 2004    (JP)    ............................. 2004-074902

(51) Int. Cl.
 H02J 7/00    (2006.01)
 H02J 7/04    (2006.01)
(52) U.S. Cl. ..................... 320/128; 320/133; 320/135; 320/137
(58) Field of Classification Search ................. 320/128, 320/136, 155, 133, 137, 135
 See application file for complete search history.

(56) References Cited

U.S. PATENT DOCUMENTS 6,163,131 A * 12/2000 Gartstein et al. ............ 320/118

FOREIGN PATENT DOCUMENTS

| DE | 2846838 | 4/1980 |
| EP | 1 037 064 | 9/2000 |
| JP | 7 322513 | 12/1995 |
| JP | 8 222279 | 8/1996 |
| JP | 9 322417 | 12/1997 |
| JP | 2000 23374 | 1/2000 |
| JP | 2000 41341 | 2/2000 |
| JP | 2000 260486 | 9/2000 |
| JP | 2001 231179 | 8/2001 |

* cited by examiner

*Primary Examiner*—Edward Tso
*Assistant Examiner*—Alexis Boateng
(74) *Attorney, Agent, or Firm*—Frommer Lawrence & Haug LLP; William S. Frommer; Thomas F. Presson

(57) ABSTRACT

A battery apparatus is provided, in which even if a battery thereof is used under the low temperature environment or the battery has been charged/discharged many times, by changing and setting the end voltage that ends the discharge from the battery cell on the basis of the property of the battery, the dischargeable period can be extended. A battery apparatus for controlling an operation by detecting a charge/discharge state of a battery cell, which is chargeable/dischargeable, to supply a power source voltage to an electronic apparatus, includes: end voltage setting means for setting an end voltage that ends the discharge from the battery cell on the basis of a discharge property of the battery cell; and an end a voltage controller for varying and controlling a setting of the end voltage in accordance with a condition of the battery cell being used.

9 Claims, 10 Drawing Sheets

FIG. 7

| | TEMPERATURE FOR USE IS AT 25°C | TEMPERATURE FOR USE IS AT 0°C |
|---|---|---|
| CHARGED/ DISCHARGED AT 0 TIMES | 3.20V | 3.10V |
| CHARGED/ DISCHARGED AT 100 TIMES | 3.15V | 3.05V |

FIG. 8

| | | END VOLTAGE 3.20V | | CHANGE END VOLTAGE TO THE VALUE SHOWN IN FIG.7 | |
|---|---|---|---|---|---|
| DISCHARGED STATE | DISCHARGE PERIOD | COMPARISON WITH THE CASE OF 0 TIMES AT 25°C | REMAINING POWER TO 3.0V | DISCHARGED PERIOD | COMPARISON WITH THE CASE OF 0 TIMES AT 25°C | REMAINING POWER TO 3.0V |
| 0 TIMES AT 25°C | 1:14 | 100% | 0.01 | 1:14 | 100% | 0.01 |
| 100 TIMES AT 25°C | 1:08 | 91.9% | 0.02 | 1:09 | 93.2% | 0.01 |
| 0 TIMES AT 0°C | 0:54 | 73.0% | 0.05 | 0:57 | 77.0% | 0.02 |
| 100 TIMES AT 0°C | 0:36 | 48.6% | 0.09 | 0:43 | 58.1% | 0.02 |

BATTERY APPARATUS AND DISCHARGE CONTROLLING METHOD OF BATTERY APPARATUS

CROSS REFERENCE TO RELATED APPLICATIONS

The present document contains subject matter related to Japanese Priority Document JP2004-074902, filed in the Japanese Patent Office on Mar. 16, 2004, the entire contents of which being incorporated herein by reference.

BACKGROUND OF THE INVENTION

1. Field of the Invention

The present invention relates to a battery apparatus for a battery pack having a chargeable/dischargeable battery cell or the like and a discharge controlling method of a battery apparatus.

2. Description of Related Art

In the related art, a battery pack having a battery cell is provided as a secondary battery such as a lithium battery, a NiCd battery, a nickel hydrogen battery and the like. Typically, the battery pack includes: a microcomputer for calculating a battery remaining amount of the battery cell and for communicating with an electronic apparatus whose power source is the battery cell; a peripheral circuit of this microcomputer; and a state detecting circuit of the battery cell required to calculate the battery remaining amount by this microcomputer.

The number of times where the foregoing battery pack can be charged and discharged is not infinite. Also, the maximum number of charge/discharge times where the charge/discharge property in the allowable range on the usage can be maintained is determined as a certain number, depending on the kind of the battery cell and the like.

The present applicant proposes, as a one that counts up to the maximum number of the charge/discharge times in order to set the battery remaining amount, when the charge/discharge of the battery causes the deterioration in the battery cell, a battery pack that can count the number of the charge/discharge times on the basis of the deterioration and can accurately set the battery remaining amount on the basis of the deterioration; a charge/discharge counting method, and a method of setting the battery remaining amount of the battery pack (refer to a patent document: Japanese Patent Application Publication No. 2000-260486).

The present applicant also proposes as a one that calculates the battery remaining amount, even if a temperature change occurs in the battery cell, a battery cell that can accurately calculate the battery remaining amount on the basis of the temperature change, and the method of calculating the battery remaining amount (refer to a patent document: Japanese Patent Application Publication No. 2000-260488).

SUMMARY OF THE INVENTION

In order to supply a power source voltage to an electronic apparatus using the foregoing battery, in the microcomputer for detecting a voltage of the battery cell on the battery side to control the operation, an end voltage for ending the charge from the battery cell depending on the property of the battery cell is set.

However, in the battery such as the lithium ion battery or the like, the phenomenon is recognized from the experiment, where an impedance of the battery cell is increased if the battery is used in a low temperature environment or the number of the charge/discharge times is increased. This results in disadvantages that if the impedance of the battery cell is increased, the voltage drop is induced, and that if the operation of an apparatus using the battery is completed with the same end voltage, the operable period becomes shorter.

The increase in the impedance of the battery cell depending on the condition of the battery being used will be described below. FIG. 9 is a view showing the impedance of the battery cell based on the temperature and the number of the charge/discharge times. In FIG. 9, a cell 93 of a battery 91 includes therein an impedance component of 150 mΩ at 25° C. when it is not used, as indicated by a reference numeral 92. When the discharge is executed under this condition, the voltage of the cell 93 is dropped. This does not imply that a resistor actually exists in the cell 93, but this is the pseudo factor measured from the voltage drop when the discharge is executed. As indicated by reference numeral 94, when an output voltage drop is measured, it is recognized that the voltage drop is generated similar to the case where the resistor of 150 mΩ is existed. Thus, the pseudo impedance at a normal temperature when it is not used is considered to 150 mΩ.

FIG. 10 is a view showing an impedance of the battery cell when it is used under a low temperature (0° C.) environment. In FIG. 10, when the discharge is executed under the low temperature environment, the chemical reaction inside a cell 103 of a battery 101 becomes slow and the output voltage is dropped. As indicated by reference numeral 104, when an inner resistance value is pseudo-measured from the voltage drop, it shows the property similar to the case where a resistor of 250 mΩ is added to the cell 103 as indicated by reference numeral 102. Thus, the pseudo impedance at the time of the low temperature is set to 250 mΩ.

FIG. 11 is a view showing an impedance of the battery cell after the charge/discharge has been executed 100 times. In FIG. 11, as the number of the discharges is increased and a cell 113 is deteriorated, the chemical reaction inside the cell 113 becomes slow, thereby dropping the output voltage. As indicated by reference numeral 114, when the inner resistance value is pseudo-measured from the voltage drop, it shows the property similar to the case where a resistor of 200 mΩ is added to the cell 113 as indicated by reference numeral 112. Thus, the pseudo impedance when the discharge has been executed 100 times is set to 200 mΩ.

FIG. 12 is a view showing an impedance of the battery cell after the battery has been charged/discharged 100 times is used at a low temperature (0° C.). In FIG. 12, when the battery in which the number of the charge/discharge times has been increased is discharged under the low temperature environment, the chemical reaction inside a cell 123 of a battery 121 becomes slow, which consequently further drops the output voltage. As indicated by reference numeral 124, when the inner resistance value is pseudo-measured from the voltage drop, it shows the property similar to the case where a resistor of 350 mΩ is added to the cell 123 as indicated by reference numeral 122. Thus, the pseudo impedance at the low temperature after the charge/discharge has been executed 100 times is set to 350 mΩ.

In view of the above circumstances, the present invention provides a battery apparatus, in which even if a battery thereof is used under the low temperature environment or if a battery thereof has been charged/discharged many times, by changing and setting the end voltage that ends the discharge from the battery cell on the basis of the property of the battery, the dischargeable period can be extended, and also provides a discharge controlling method of a battery apparatus.

In order to address the above-mentioned drawbacks, the battery apparatus of the present invention includes: end voltage setting means for setting an end voltage that ends the discharge from a battery cell on the basis of the discharge property of the battery cell; and an end voltage controller for varying and controlling the setting of the end voltage in accordance with a condition in which the battery cell is used.

Consequently, in the battery apparatus for supplying a power source voltage to an electronic apparatus, at first, the end voltage setting means sets the end voltage that ends the discharge from the battery cell on the basis of the discharge property of the battery cell. Next, the end voltage controller varies and controls the setting of the end voltage, depending on the condition of the battery cell being used. The battery apparatus has therein, for example, a microcomputer and a temperature detecting device and obtains the information, such as the condition of the battery cell being used and the like, through communications inside the battery apparatus. Also, the information such as the condition of the battery cell being used and the like is transmitted and received through the communications between the electronic apparatus using the battery apparatus and the battery apparatus. Otherwise, the battery pack itself counts the number of the charge/discharge times in accordance with the change in the voltage.

Accordingly, since the condition of the battery cell being used is detected and a point to end the discharge of the battery cell is set, even if the battery cell whose discharge property is differed is used, owing to having the end voltage for ending the discharge inside the battery pack, the setting of the end voltage can be varied and controlled, so that the battery cell can be effectively used.

Further, the discharge controlling method of the battery apparatus in the present invention includes: a step of setting the end voltage that ends the discharge from the battery cell on the basis of the discharge property of the battery cell; and a step of varying and controlling the setting of the end voltage, depending on the condition of the battery cell being used.

Consequently, as the change in the condition of the battery cell being used, when the battery apparatus detects that an ambient temperature at the battery cell is used is lower than a normal temperature or the number of the charge/discharge times is increased, the battery apparatus recognizes that the drop in the battery voltage becomes greater than the normal because the impedance of the battery cell is increased. At this time, the battery apparatus controls so that the setting of the end voltage is to be changed in accordance with the increase of the battery impedance.

Thus, in accordance with the detection of the temperature drop and of the number of the charge/discharge times, the end voltage that ends the output is dropped when it is recognized that the impedance of the battery is increased, so that it is possible to use the battery effectively and for a long time.

According to the present invention, in the battery apparatus such as the battery pack and the like in which the impedance of the battery cell is increased, by dropping the end voltage that ends the discharge in the electronic apparatus, it is possible to extend the dischargeable period.

In addition, at this time, in the battery apparatus such as the battery pack and the like for measuring the battery temperature and the number of the charge/discharge times, by measuring them and recognizing the fact that the impedance of the battery cell is increased, it is possible to changes and controls the setting of the end voltage.

In addition, the end voltage that ends the discharge in the electronic apparatus is held as the inner data in a memory in the battery apparatus such as the battery pack and the like. Thus, even if the battery apparatus such as the battery pack in which the discharge property of the battery cell is differed is used, it is possible to increase the discharge period effectively than those of the techniques in the related art.

Also, as the reference to determine the change in the condition of the battery cell being used, it is not limited to the case, for example, of the setting in which the thresholds of the ambient temperature when using the battery cell and the number of the charge/discharge times are held in the inner memory, and the case of the setting in which the end voltage is calculated by using the inner microcomputer on the basis of the ambient temperature when using the battery cell and the number of the charge/discharge times is also possible, so that the further detailed setting is possible.

Further, besides the above descriptions, the inner microcomputer actually measures the impedance of the battery cell, and the end voltage is calculated on the basis of the resistance value, so that the further detailed setting is possible.

BRIEF DESCRIPTION OF THE DRAWINGS

FIG. 7 is a table showing an end voltage setting example based on a temperature for use and the number of charge/discharge times;

FIG. 8 is a table showing an operation period after an end voltage is changed;

DESCRIPTION OF THE PREFERRED EMBODIMENTS

An embodiment of the present invention will be described below by referring to the attached drawings. It should be noted that, in the following embodiment, an info-lithium battery having a built-in microcomputer for transmitting/receiving information to/from an electronic apparatus and a digital still camera as the electronic apparatus using the battery will be explained for convenience. However, the present invention is not limited thereto.

Figure 1:
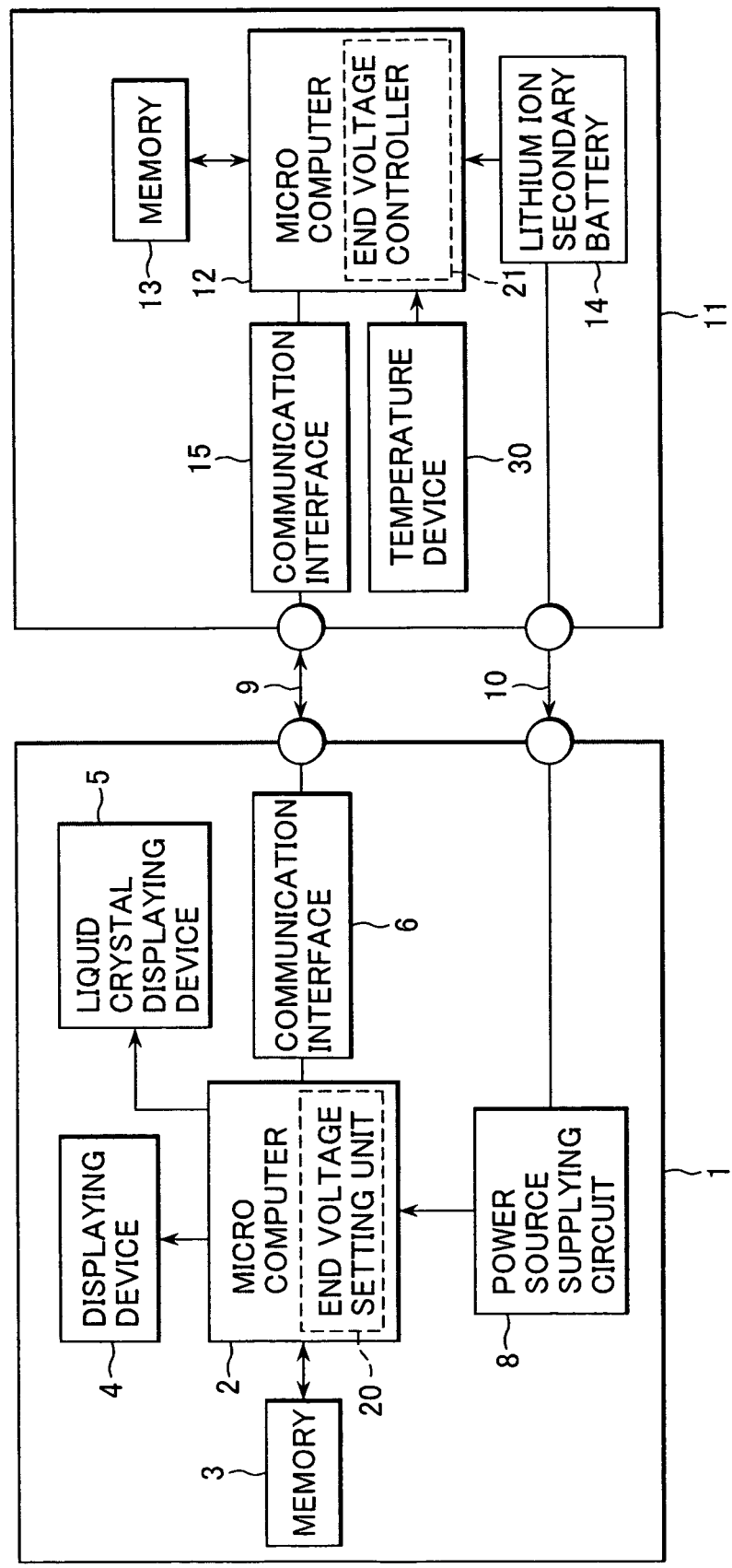
FIG. 1 is a view showing a connection between an apparatus body and a battery which are applied to the embodiment of the present invention.

FIG. 1 is a view showing a connection between an apparatus body and a battery which are applied to the embodiment of the present invention. The embodiment of the present invention can be applied, for example, to a battery pack on a battery side 11 connected to a video camera apparatus on an apparatus side 1 as shown in FIG. 1.

The battery pack 11 is attached, for example, to a battery attaching unit of the video camera apparatus 1 through a communication path 9. To the video camera apparatus 1, a power source voltage is supplied from a lithium ion secondary battery 14 via a terminal 10, and battery information is also transmitted through a microcomputer 12, a communication interface 15 and a memory 13.

Here, between the battery pack 11 and the video camera apparatus 1, which is the apparatus using the battery, a battery remaining amount, a battery end voltage and the like are transmitted and received through the communication path 9 in addition to being supplied the voltage from the lithium ion secondary battery 14.

For this reason, an end voltage controller 21 of the microcomputer 12 of the battery pack 11 controls the calculation of a battery remaining amount and the setting of an operable voltage range. Corresponding to this, an end voltage setting unit 20 of a microcomputer 2 of the video camera apparatus 1 sets the end voltage of the power source voltage supply inside the apparatus, and displays the remaining amount and the end voltage on a displaying device 4 and a liquid crystal displaying device 5.

It should be noted that, as the power source voltages supplied to the inside of the video camera apparatus 1, there are, for example, a control voltage when the microcomputer 2 writes or reads data to or from a memory 3, a control and drive voltage when an image data imaged by a camera unit (not shown) is recorded on a recording medium of a recording unit (not shown), and a drive voltage when a lens of the camera unit (not shown) is accommodated or pulled out.

Here, in the embodiment of the present invention, the end voltage controller 21 of the microcomputer 12 of the battery pack 11 is configured to have the functions of: end voltage setting means for setting the end voltage that ends the discharge from the lithium ion secondary battery 14 that is the battery cell, on the basis of the discharge property of the lithium ion secondary battery 14; and an end voltage controller for varying and controlling the setting of the end voltage on the basis of the condition in which the lithium ion secondary battery 14 is used.

Figure 2:
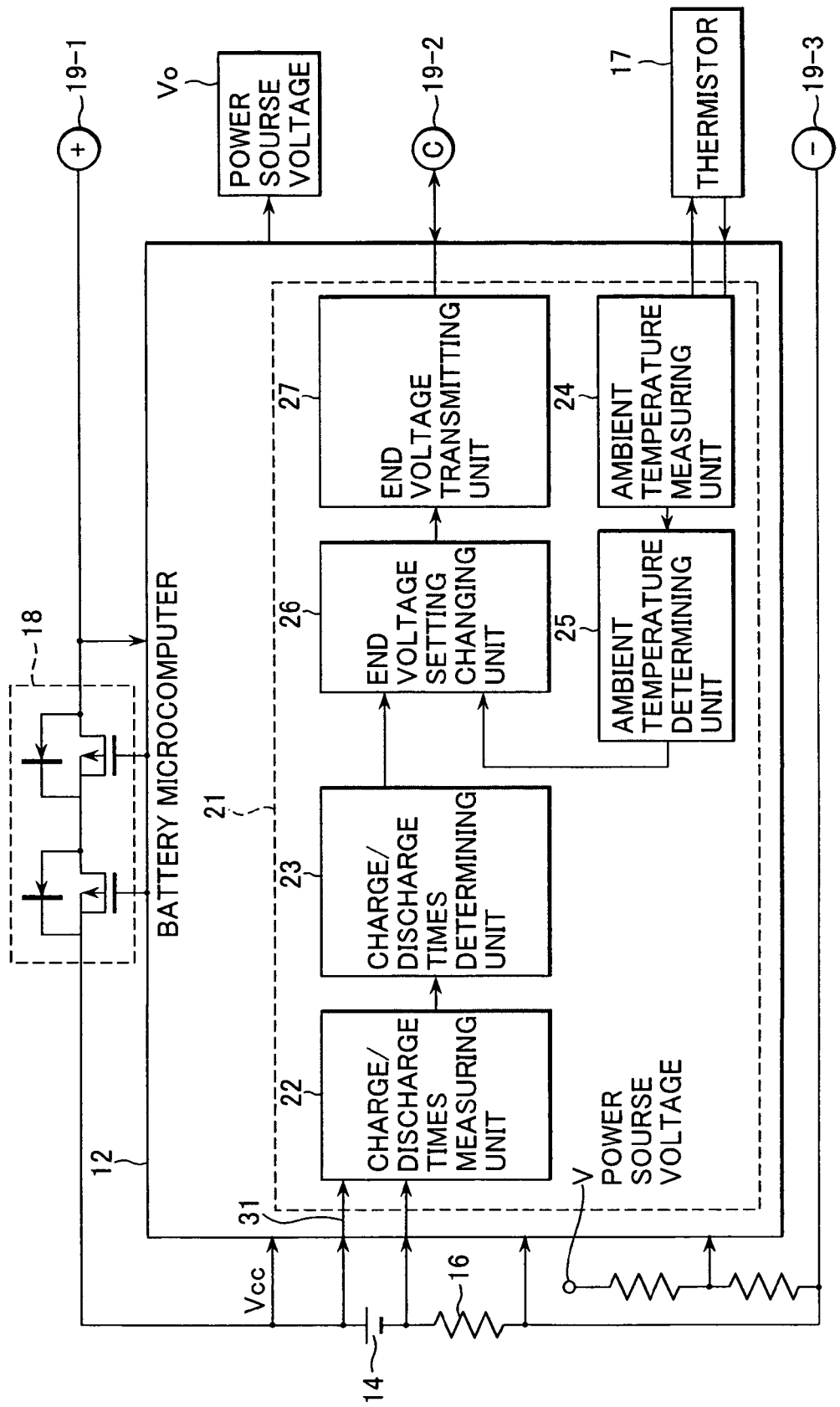
FIG. 2 is a configuration view of a battery microcomputer.

FIG. 2 is a configuration view of a battery microcomputer. The circuit configuration of the microcomputer 12 of the battery pack 11 will be described below. As shown in FIG. 2, the microcomputer 12 of the battery pack 11 prepares: the lithium ion secondary battery 14 that is the battery cell; a plus (+) terminal 19-1 connected through a charge/discharge voltage controller 18 to a positive electrode of the lithium ion secondary battery 14; a minus (−) terminal 19-3 connected through a current detecting resistor 16 to a negative electrode of the lithium ion secondary battery 14; and a communication terminal 19-2.

The lithium ion secondary battery 14 supplies the power source voltage through the plus (+) terminal 19-1 and the minus (−) terminal 19-3 to an external apparatus. In addition, in the lithium ion secondary battery 14, the charge/discharge voltage controller 18 controls the excessive discharge or excessive charge.

Further, the end voltage controller 21 of the microcomputer 12 of the battery pack 11 includes: a detecting circuit for measuring and detecting a current flowing through the current detecting resistor 16; an A/D converter for digitalizing a charge/discharge current value and a battery voltage value; a central processing unit (hereafter, referred to as "CPU") for counting the number of the performed charges/discharges (hereafter, referred to as "number of the charge/discharge times") and calculating the battery remaining amount; a random access memory (hereafter, referred to as "RAM") for temporarily storing a present voltage level and the like of the lithium ion secondary battery; and a read only memory (hereafter, referred to as "ROM") in which a CPU control program is stored.

The current detecting circuit detects the current flowing through the current detecting resistor 16 at the time of the charge or discharge, and supplies the detected current value to the A/D converter. The A/D converter digitalizes the current value from the current detecting circuit and supplies it to the CPU. The A/D converter also digitalizes voltages at the both end of the lithium ion secondary battery 14 and supplies them to the CPU.

A thermistor 17 for measuring an ambient temperature from a change in a resistance value is also installed in the housing of the battery pack 11. The end voltage controller 21 has a temperature detecting circuit for detecting a temperature by measuring a current flowing through a resistor of the thermistor 17. The temperature detecting circuit detects a current flowing through a temperature detecting resistor at the time of charge or discharge, and supplies the detected current value to the A/D converter. The A/D converter digitalizes the current value from the temperature detecting circuit and supplies it to the CPU.

The functions in this embodiment of the end voltage controller 21 having the foregoing configuration are explained. This end voltage controller 21 includes: a charge/discharge times measuring unit 22 for detecting a voltage change in a cell voltage 31 of the lithium ion secondary battery 14 to detect the number of the charge/discharge times in response to the increase in the pseudo resistance of the lithium ion secondary battery 14; a charge/discharge times determining unit 23 for determining that the number of the charge/discharge times detected by the charge/discharge times measuring unit 22 comes into the range where the pseudo resistance of the lithium ion secondary battery 14 is increased; and an end voltage setting changing unit 26 for changing the setting of the end voltage by dropping it in accordance with the number of the charge/discharge times.

Further, the end voltage controller 21 includes: a ambient temperature measuring unit 24 for detecting an ambient temperature of the lithium ion secondary battery 14 and to detect a temperature drop corresponding to the increase in the pseudo resistance of the lithium ion secondary battery 14; a ambient temperature determining unit 25 for determining that the temperature drop detected by the ambient temperature measuring unit 24 becomes in the range where the pseudo resistance of the lithium ion secondary battery 14 is increased; and the end voltage setting changing unit 26 for changing the setting of the end voltage by dropping it in accordance with the temperature lowered.

The end voltage controller 21 also includes an end voltage transmitting unit 27 for supplying variable setting information of the end voltage through the communication terminal 19-2 to the electronic apparatus.

Further, the end voltage controller 21 is configured to reduce the end voltage to set in the range where the discharge property of the lithium ion secondary battery 14 is loosely dropped down, which is changeable in accordance with the condition in which the lithium ion secondary battery 14 is used.

The operation of the end voltage controller 21 in the battery pack 11 configured as above will be described below.

Figure 3:
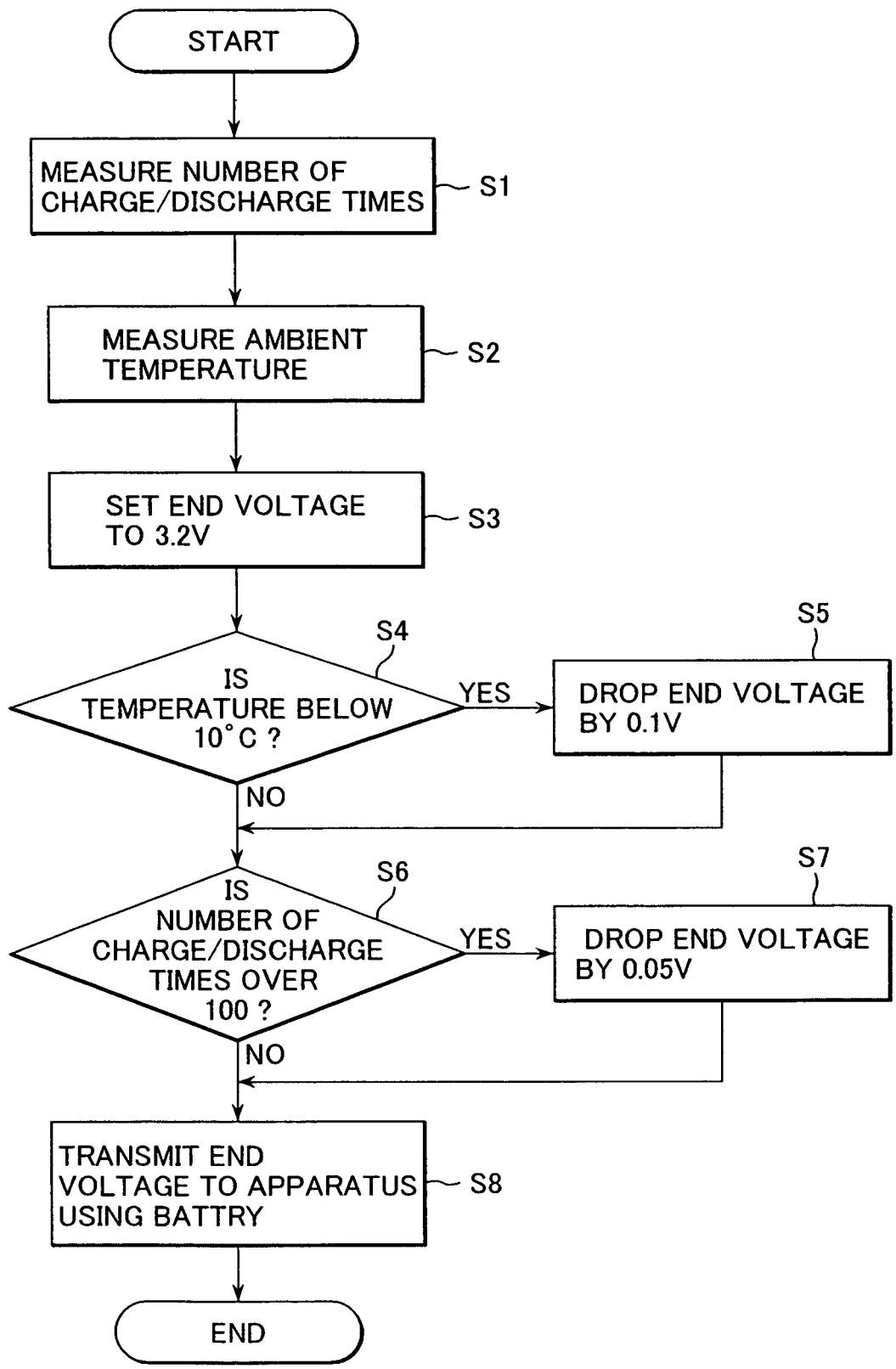
FIG. 3 shows a flowchart of an end voltage control operation.

FIG. 3 shows a flowchart of the end voltage control operation. In FIG. 3, at first, the charge/discharge measuring unit 22 shown in FIG. 2 measures the number of the charge/discharge times (Step S1). Next, the ambient temperature measuring unit 24 shown in FIG. 2 measures the ambient temperature (Step S2). Then, the end voltage setting changing unit 26 sets the end voltage to 3.2V (Step S3).

Here, the ambient temperature determining unit 25 determines whether or not the temperature drop detected by the ambient temperature measuring unit 24 becomes in the range where the pseudo resistance of the lithium ion secondary battery 14 is increased (Step S4). If it is determined in this temperature determination that the temperature drop is occurred, the end voltage setting changing unit 26 controls so that the end voltage is dropped, for example, by 0.1V (Step S5).

Next, when it is determined in this temperature determination that the temperature drop is not occurred, or after the end voltage is controlled so as to drop by 0.1V due to the temperature drop, the charge/discharge determining unit 23 determines whether or not the number of the charge/discharge times is over 100 times (Step S6). If the number of the charge/discharge times is over 100 times, the end voltage setting changing unit 26 controls so that the end voltage is dropped, for example, by 0.05V (Step S7). Finally, the end voltage transmitting unit 27 transmits the end voltage to the apparatus using the battery pack 11.

In this manner, by measuring the number of the charge/discharge times and the temperature, the end voltage for ending the discharge is consequently changed and then transmitted the changed end voltage to the apparatus using the battery. Since it is controlled so that the setting of the end voltage is changed, the apparatus using the battery can operate for a longer period than ever before.

Figure 4:
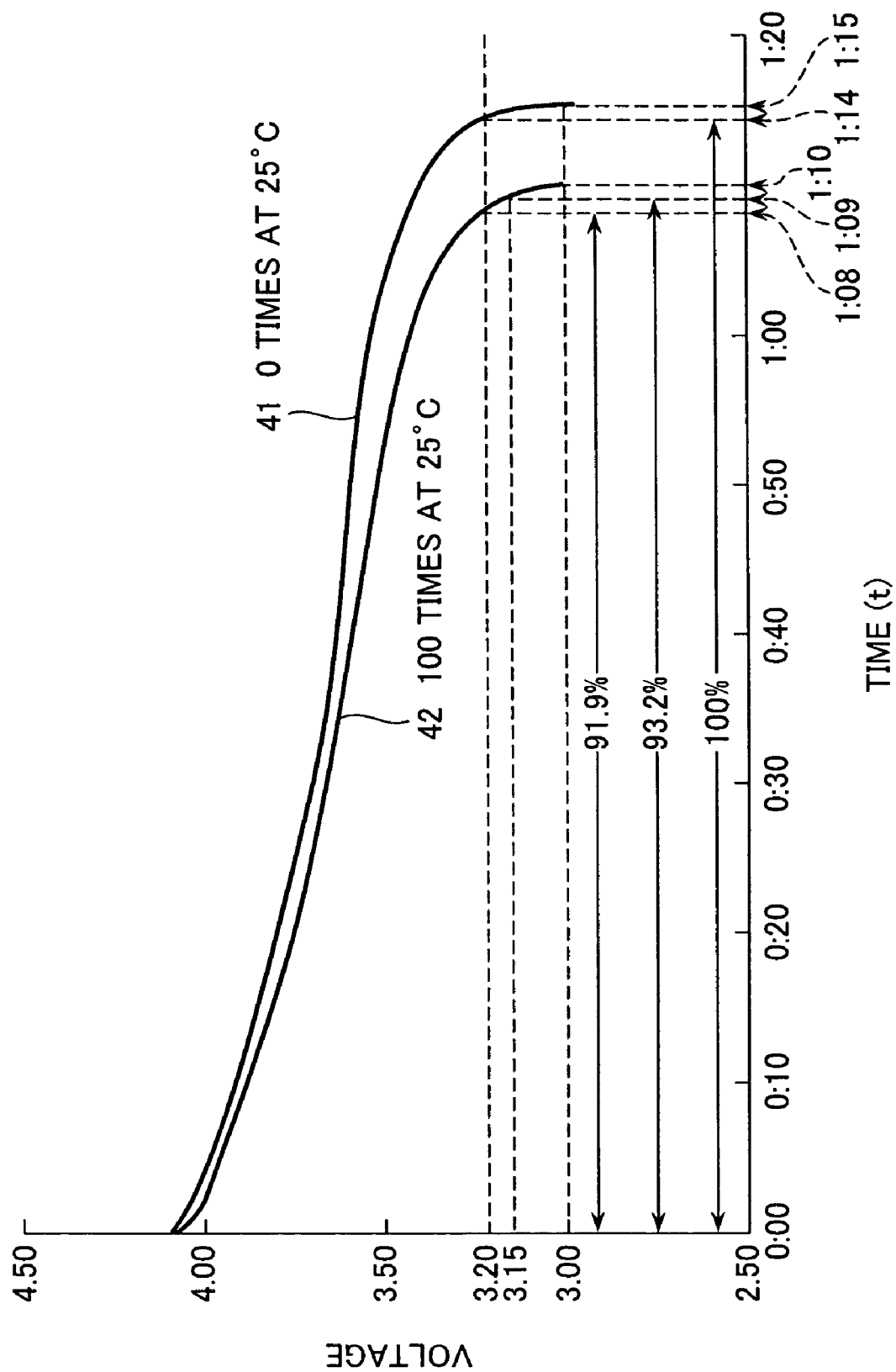
FIG. 4 is a graph showing a charge/discharge property of 100 times at 25° C.

It is assumed that, for example, a battery having the charge/discharge property in which the number of the charge/discharge times is 0 times at 25° C. of a normal temperature as shown in FIG. 4 is used. In this case, in order to save data or carry out the ending process after the use of the battery is ended, it is preferred to end the battery with a remaining power. Accordingly, in the case of the battery having the charge/discharge property of 0 time at 25° C. indicated by a line 41, 3.2V is set as the end voltage.

In the charge/discharge property of 0 times at 25° C. as indicated as a line 41, the voltage is sharply dropped from 3.2V to 3.0V, so if the use of the electronic apparatus is ended at the voltage of 3.2V, it can be ended with a remaining power about one minute, which is a period from 1 hour and 14 minutes to 1 hour and 15 minutes, at a load of 2.0W until the coming of 3.0V.

On the other hand, when using the same battery, but which has been charged/discharged 100 times at 25° C. of the normal temperature, since an impedance of the battery is increased, it is possible to confirm that the voltage drop is significant like the charge/discharge property of 100 times at 25° C. indicated by the line 42. That is, in the case of using the battery having the charge/discharge property of 100 times at 25° C. indicated by line 42, the charge/discharge property drops still loosely from 3.2V to 3.0V. Thus, if 3.2V is set to the end voltage similarly to the case in the normal temperature, the period until the coming of 3.0V is ended while having a remaining power of about 2 minutes, which is a period from 1 hour and 8 minutes to 1 hour and 10 minutes, at a load of 2.0 W. Accordingly, in the case of using the battery having the charge/discharge property of 100 times at 25° C. indicated by line 42, it is controlled so that the end voltage is changed and set to 3.15V. Therefore, the period from 3.15V to 3.0V can be ended with the remaining power of about one minute, which is a period from 1 hour and 9 minutes and 1 hour and 10 minutes. It is to be noted that, in this case, the charge/discharge property of 100 times at 25° C. indicated by line 42 is sharply dropped when the voltage is dropped from 3.0V.

Figure 5:
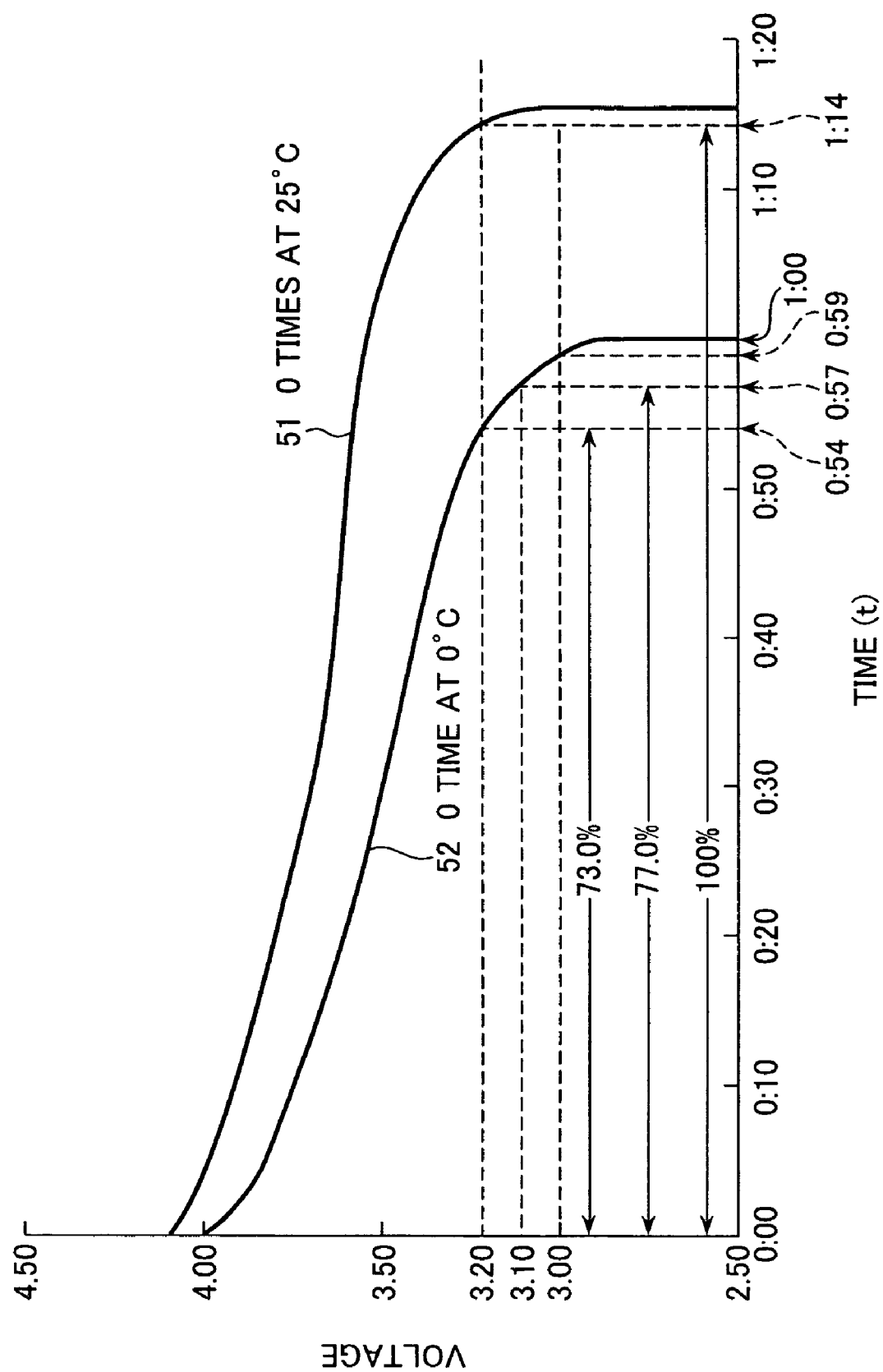
FIG. 5 is a graph showing a charge/discharge property of 0 time at 0° C.

Similarly, it is assumed that the same battery is used under the low temperature environment of 0° C. as shown in FIG. 5. When the ambient temperature of the battery is dropped, the impedance of the battery cell is increased, so the increase of the impedance leads to become the charge/discharge property of 0 time at 0° C. indicated by a line 52. Also in this case, the voltage is greatly dropped similarly to the case in which the charge/discharge has been performed many times. Similarly, as compared with the charge/discharge property of the battery which has been charged/discharged 0 times at 25° C. of the normal temperature shown in 51, in the charge/discharge property of 0 times at 0° C. indicated by line 52, if the end voltage is set to 3.2V, the period until the coming of 3.0V is ended while having the remaining power of about 5 minutes, which is a period from 0 hour and 54 minutes to 0 hour and 59 minutes, at a load of 2.0 W. Accordingly, in the case of using the battery having the charge/discharge property of 0 times at 0° C. indicated by line 52, it is controlled so that the end voltage is changed and set to 3.10V. Therefore, the period from 3.10V to 3.0V can be ended with the remaining power of about 2 minutes, which is a period from 0 hour and 57 minutes to 0 hour and 59 minutes. It should be noted that, in this case, the charge/discharge property of 0 times at 0° C. indicated by line 52 is sharply dropped when the voltage is dropped from 2.8V.

Figure 6:
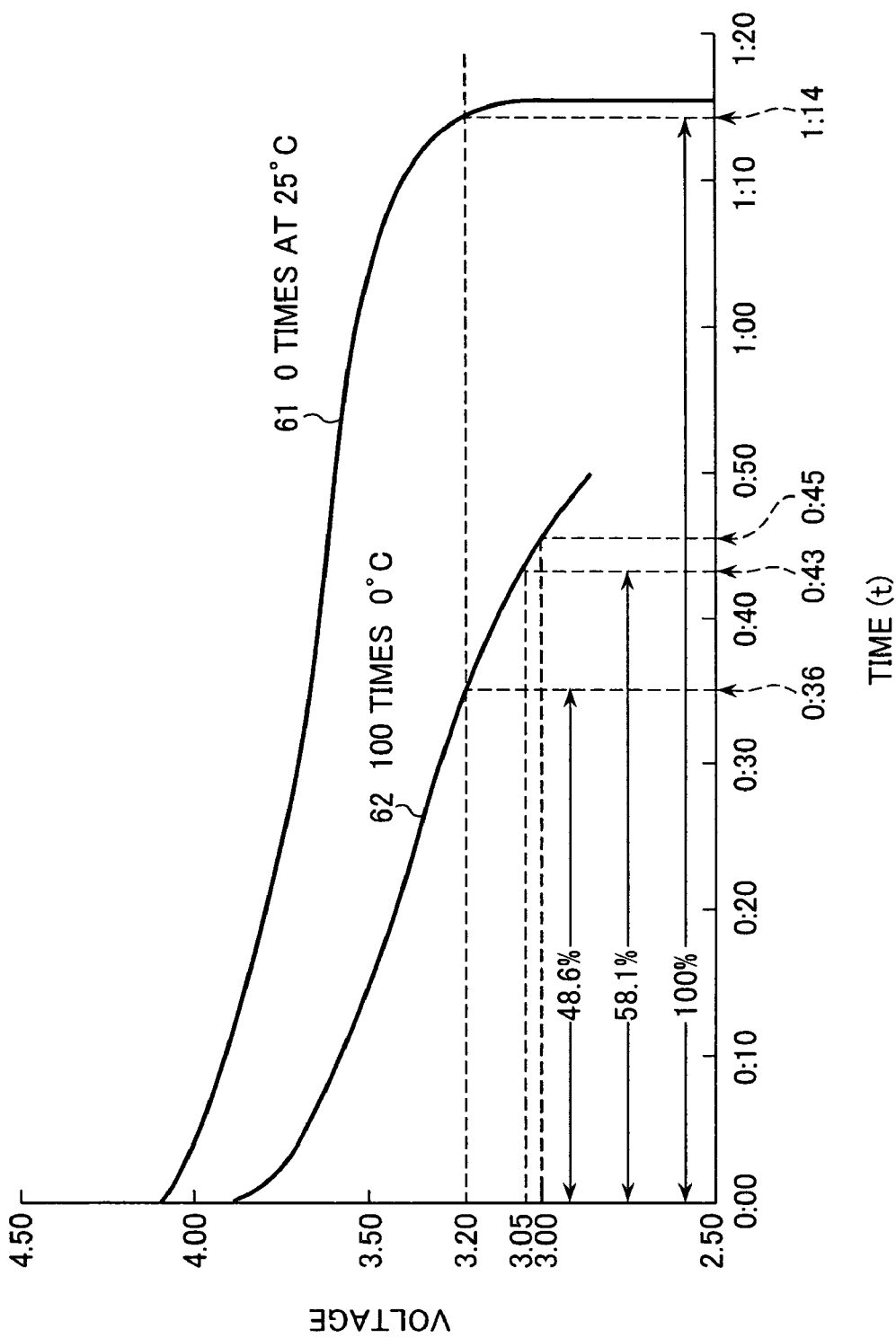
FIG. 6 is a graph showing a charge/discharge property of 100 times at 0° C.
Figure 9:
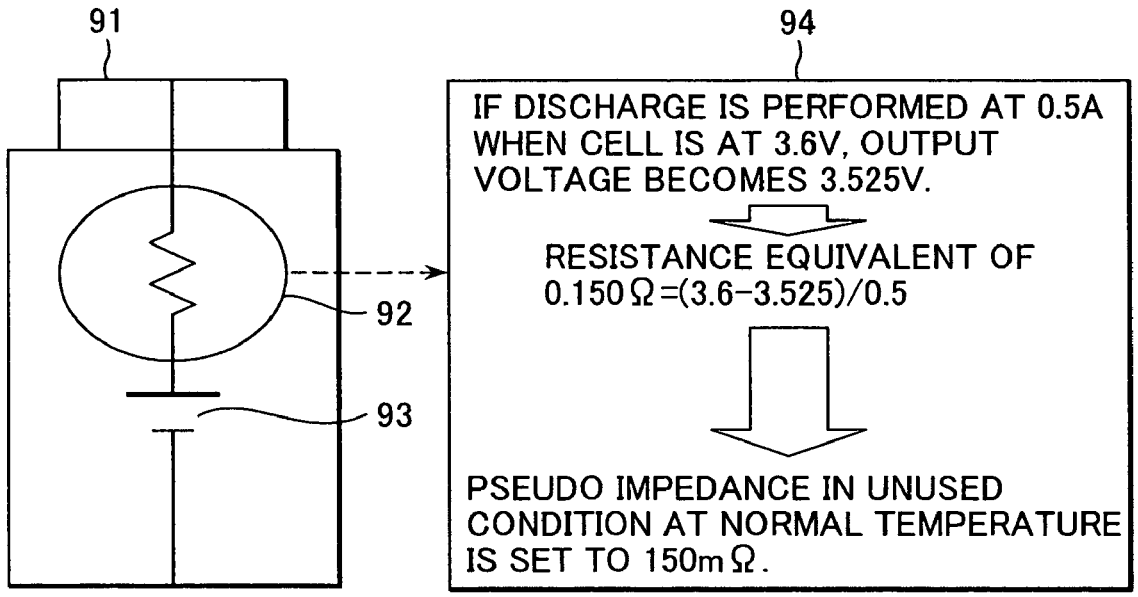
FIG. 9 is a view showing an impedance of a battery cell based on the temperature for use and the number of charges/discharge times.
Figure 10:
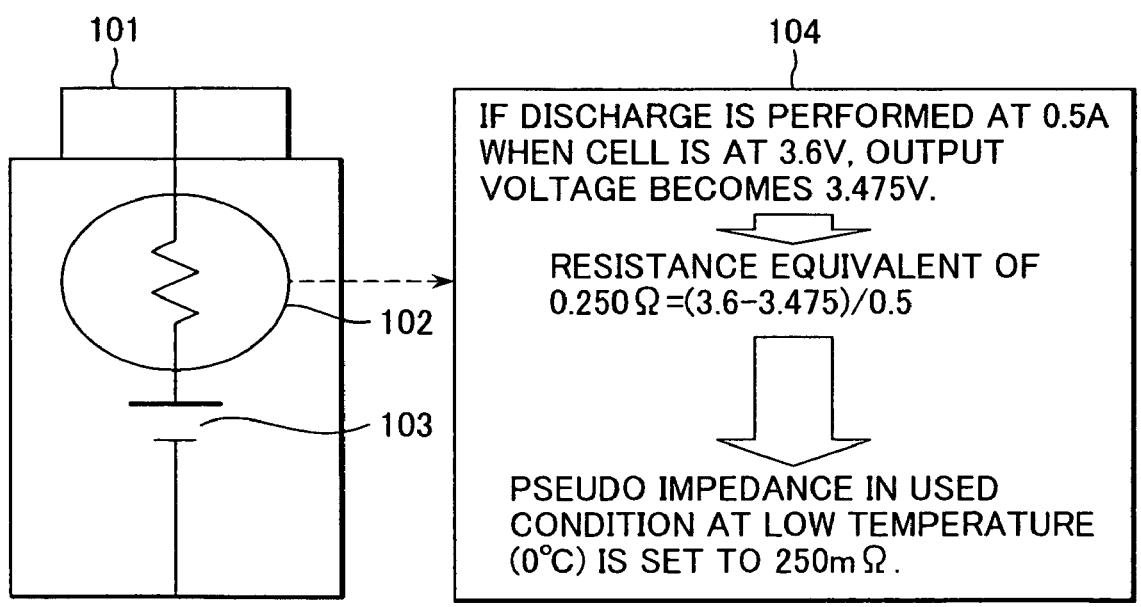
FIG. 10 is a view showing an impedance of a battery cell when it is used under a low temperature (0°C.) environment.
Figure 11:
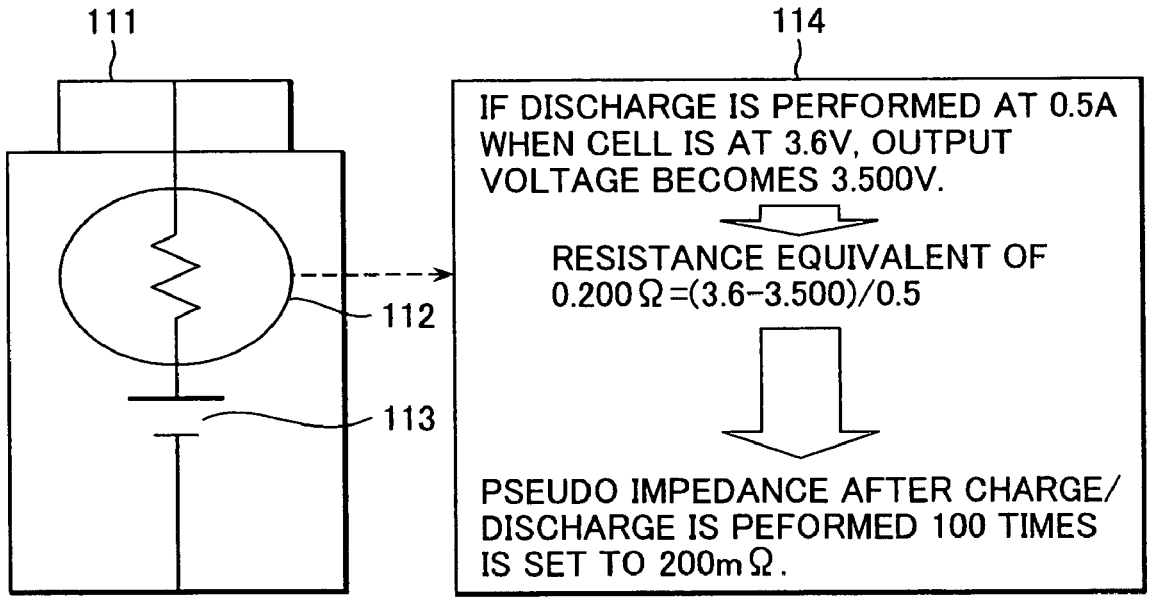
FIG. 11 is a view showing an impedance of a battery cell which has been charged/discharged 100 times.
Figure 12:
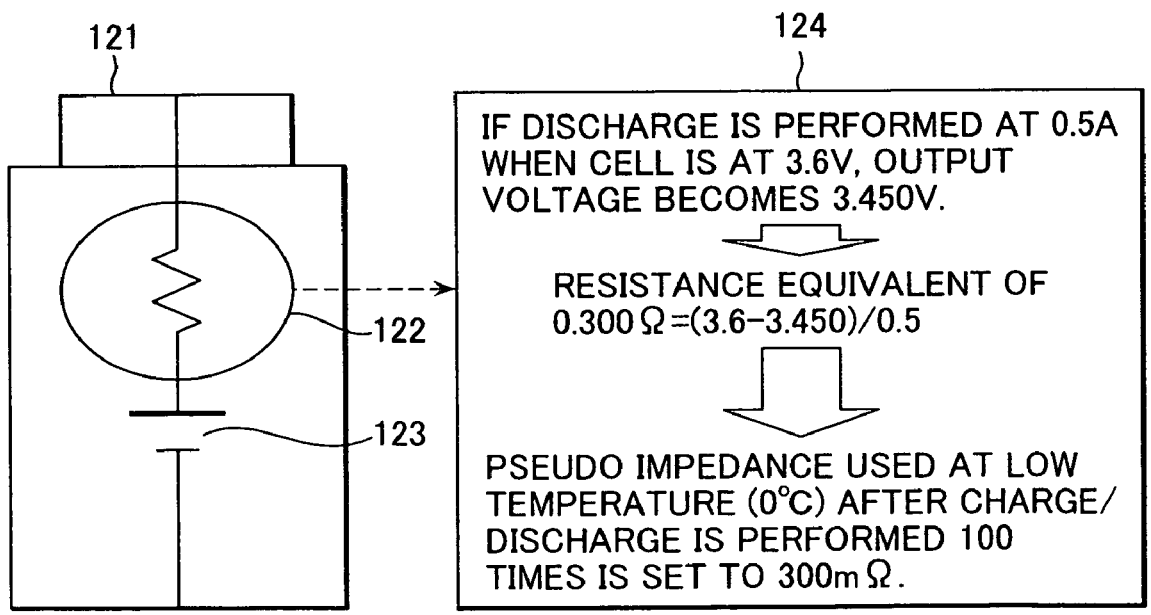
FIG. 12 is a view showing an impedance of a battery cell which has been charged/discharged 100 times is used at a low temperature.

Moreover, as shown in FIG. 6, when a battery which has been charged/discharged 100 times is used under the low temperature environment of 0° C., the voltage is further dropped. Similarly, as compared with the battery which has been charged/discharged 0 times at 25° C. of the normal temperature indicated by a line 61, if the end voltage is set to 3.2V, the period until the coming of 3.0V is ended while having a remaining power of about 9 minutes, which is a period from 0 hour and 36 minutes to 0 hour and 45 minutes, at a load of 2.0 W. Accordingly, in the case of using the battery having the charge/discharge property of 100 times at 0° C. indicated by line 62, it is controlled so that the end voltage is changed and set to 3.05V. Therefore, the period from 3.05V to 3.0V can be ended with the remaining power of about 2 minutes, which is a period from 0 hour and 43 minutes and 0 hour and 45 minutes. It should be noted that, in this case, when the charge/discharge property of 100 times at 0° C. indicated the line 62 is sharply dropped is when the voltage is dropped from 2.8V.

As described above, if the battery is ended with the large quantity of power remained, the property as the battery is not perfectly shown and not utilized effectively. In addition, the life period of the battery becomes shorter under the foregoing environment.

Therefore, as described above, in the present embodiment, the end voltage is separately controlled so as to be changed and set under the condition in which the impedance is increased. For example, when the number of the charge/discharge times is over 100 times as shown in FIG. 4, the end voltage is set to 3.15V. Similarly, the period until the coming of 3.0V can be set as the remaining power of about 1 minute at the load of 2.0 W, thereby enabling the usable period of the battery longer.

In addition, the end voltage used at 0° C. shown in FIG. 5 is set to 3.1V. Consequently, the period until the coming of 3.0V has the remaining power of about two minutes at the load of 2.0 W. At the same time, the usable period of the battery can be extended from 54 minutes to 57 minutes.

Moreover, when the battery which has been charged/discharged over 100 times is used under the environment of 0° C. as shown in FIG. 6, the end voltage is set to 3.05V. Consequently, the period until the coming of 3.0V can be set as the remaining power of about 2 minutes at the load of 2.0 W, and the usable period of the battery can be extended.

FIG. 7 is a table showing an end voltage setting example based on the temperature for use and the number of the charge/discharge times. In FIG. 7, when the number of the charge/discharge times is 0 as indicated by reference numeral 71 and the temperature for use is 25° C. as indicated by reference numeral 73, the end voltage is 3.20V. When the number of the charge/discharge times is 0 as indicated by reference numeral 71 and the temperature for use is 0° C. as indicated by reference numeral 74, the end voltage is 3.10V. Also, when the number of the charge/discharge times is 100 as indicated by reference numeral 72 and the temperature for use is 25° C. as indicated by reference numeral 73, the end voltage is 3.15V. When the number of the charge/discharge times is 100 as indicated by reference numeral 72 and the temperature use is 0° C. as indicated by reference numeral 74, the end voltage is 3.05V.

FIG. 8 is a table showing an operation period after the end voltage is changed. In FIG. 8, when a discharge state is 0 times at 25° C. as indicated by reference numeral 81 and the end voltage is 3.20V as indicated by reference numeral 82, a discharge time 83 is 1 hour and 14 minutes, a comparison 84 with the case of 0 times at 25° C. is 100%, and a remaining power until 3.0V is 0 hour and 1 minutes.

When the discharge state is 100 times at 25° C. as indicated by reference numeral 81 and when the end voltage is 3.20V as indicated by reference numeral 82, the discharge time 83 is 1 hour and 8 minutes, the comparison 84 with the case of 0 times at 25° C. is 91.9%, and the remaining power until 3.0V is 0 hour and 2 minutes. However, when the end voltage is 3.15V as indicated by reference numeral 86, the discharge time 83 is 1 hour and 9 minutes, the comparison 84 with the case of 0 times at 25° C. is 93.2%, and the remaining power until 3.0V is 0 hour and 1 minute.

When the discharge state is 0 times at 0° C. as indicated by reference numeral 81 and when the end voltage is 3.20V as indicated by reference numeral 82, the discharge time 83 is 0 hour and 54 minutes, the comparison 84 with the case of 0 times at 25° C. is 73.0%, and the remaining power until 3.0V is 0 hour and 5 minutes. However, when the end voltage is 3.10V as indicated by reference numeral 86, the discharge time 83 is 0 hour and 57 minutes, the comparison 84 with the case of 0 times at 25° C. is 77.0%, and the remaining power until 3.0V is 0 hour and 2 minute.

When the discharge state is 100 times at 0° C. as indicated by reference numeral 81 and when the end voltage is 3.20V as indicated by reference numeral 82, the discharge time 83 is 0 hour and 36 minutes, the comparison 84 with the case of 0 times at 25° C. as indicated by reference numeral 84 is 48.6%, and the remaining power until 3.0V is 0 hour and 9 minutes. However, when the end voltage is 3.05V as indicated by reference numeral 86, the discharge time 83 is 0 hour and 43 minutes, the comparison 84 with the case of 0 times at 25° C. is 58.1%, and the remaining power until 3.0V is 0 hour and 2 minute.

As described above, by changing the end voltage depending on the temperature and the number of the charge/discharge times, it is possible to use the battery effectively and for a long time. In particular, it is significantly effective when the impedance of the battery is increased.

The battery has the property of increasing the impedance of the battery cell if it is deteriorated due to the increased number of the charge/discharge times or it is used under the low temperature environment. When the impedance is increased, the output voltage in the same condition is greatly dropped.

Therefore, when using the battery pack which has been charged/discharged many times or under the low temperature environment, the end voltage for ending the discharge of the battery is controlled to be lowered. Accordingly, the operation period of the apparatus in which the discharge is ended can be extended, so that the battery can drive the apparatus for the longer time than ever before.

In addition, the end voltage is differed depending on the discharge property of the battery cell. Thus, the end voltage is set by the battery pack itself instead of being set by the electronic apparatus, and transmitted it through the communications to the electronic apparatus. Therefore, even if the battery cell whose discharge property is differed is used, the battery pack can be effectively used.

In the present invention, the end voltage has been changed by calculating the pseudo impedance increases of the battery on the basis of the ambient temperature of the cell and the counted number of the charge/discharge times. However, it may also be possible that either one of the ambient temperature and the number of the charge/discharge times is measured to change the end voltage.

It should be understood by those skilled in the art that various modifications, combinations, sub-combinations and alterations may occur depending on design requirements and other factors insofar as they are within the scope of the appended claims or the equivalent thereof.

What is claimed is:

1. A battery apparatus for controlling a discharge over time of a battery cell that provides an electric current at a voltage that decreases during the discharge, the battery apparatus comprising:
   a voltage setting unit that retains a setting of an end voltage of the battery cell and that causes the discharge to end when the voltage decreases to the end voltage; and
   an end voltage controller that varies the setting of the end voltage of the battery cell based on at least an ambient temperature, number of discharge times, and impedance of the battery cell so that the remaining power providing time of the battery cell is kept approximately at a predetermined period; wherein said end voltage controller comprises:
   charge/discharge times detecting means for detecting the number of charge/discharge times by detecting a change of a voltage at the time of said battery cell is charged/discharged; and
   first end voltage setting changing means for reducing said setting of said end voltage in accordance with a previously specified number of charge/discharge times, if said charge/discharge times detecting means detects said previously specified number of charge/discharge times corresponding to the increase in a pseudo resistance of said battery cell.

2. The battery apparatus according to claim 1, wherein said end voltage controller comprises;
   ambient temperature detecting means for detecting an ambient temperature of said battery cell; and
   second end voltage setting changing means for dropping and changing said setting of said end voltage in accordance with a previously specified temperature drop, if said ambient temperature detecting means detects said previously specified temperature drop corresponding to the increase in a pseudo resistance of said battery cell.

3. The battery apparatus according to claim 1, wherein:
   the battery cell provides the electric current to an electronic apparatus; and the end voltage controller comprises communication means for supplying variable setting information of said end voltage to the electronic apparatus.

4. The battery apparatus according to claim 1, wherein said end voltage controller reduces and sets said end voltage in the range where a discharge property of said battery cell, which is varied in accordance with a condition of said battery cell, is loosely dropped down.

5. A method of controlling a discharge over time of a battery cell that provides an electric current at a voltage that decreases during the discharge, the method comprising:
   setting an end voltage of the battery cell;
   ending the discharge of the battery cell when the voltage decreases to the end voltage; and
   varying the setting of the end voltage of the battery cell based on at least an ambient temperature, number of discharge times, and impedance of the battery cell so that the remaining power providing time of the battery cell is kept approximately at a predetermined period.

6. The method according to claim 5, wherein varying the setting of the end voltage comprises:
   detecting a number of charge/discharge times by detecting a change of a voltage at the time of said battery cell is charged/discharged; and
   changing and dropping said setting of said end voltage in accordance with a previously specified number of charge/discharge times if the detected number of charge/discharge times is not less than said previously specified number of charge/discharge times corresponding to the increase in a pseudo resistance of said battery cell.

7. The method according to claim 5, wherein varying the setting of the end voltage comprises:
   detecting a temperature drop in accordance with an increase in a pseudo resistance of said battery cell by detecting an ambient temperature of said battery cell; and
   dropping and changing said setting of said end voltage in accordance with a previously specified temperature being lowered, if the detected ambient temperature is not greater than said previously specified temperature drop corresponding to the increase in a pseudo resistance of said battery cell.

8. The method according to claim 5, wherein varying the setting of the end voltage comprises:
   supplying setting information of said end voltage to an electronic apparatus by a communication means.

9. The discharge controlling method according to claim 5, wherein
   varying the setting of said end voltage comprises reducing said end voltage and setting said end voltage in the range where a discharge property of said battery cell, which is varied in accordance with a condition of said battery cell, is loosely dropped down.

* * * * *